United States Patent
Wei et al.

(10) Patent No.: US 9,105,478 B2
(45) Date of Patent: Aug. 11, 2015

(54) DEVICES AND METHODS OF FORMING FINS AT TIGHT FIN PITCHES

(71) Applicant: GLOBALFOUNDRIES Inc., Grand Cayman (KY)

(72) Inventors: Andy Wei, Queensbury, NY (US); Mariappan Hariharaputhiran, Ballston, NY (US); Dae Geun Yang, Watervliet, NY (US); Dae-Han Choi, Loudonville, NY (US); Xiang Hu, Clifton Park, NY (US); Richard J. Carter, Saratoga Springs, NY (US); Akshey Sehgal, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/064,840

(22) Filed: Oct. 28, 2013

(65) Prior Publication Data

US 2015/0115418 A1 Apr. 30, 2015

(51) Int. Cl.
*H01L 21/302* (2006.01)
*H01L 21/033* (2006.01)
*G03F 1/50* (2012.01)

(52) U.S. Cl.
CPC ............ *H01L 21/0332* (2013.01); *G03F 1/50* (2013.01); *H01L 21/0334* (2013.01); *H01L 21/0337* (2013.01); *H01L 21/0338* (2013.01)

(58) Field of Classification Search
CPC ............ H01L 21/0337; H01L 21/0338; H01L 21/0334; H01L 21/0332
USPC .......... 438/947, 950, 717, 736; 257/E21.038, 257/E21.039, E21.235, E21.236
See application file for complete search history.

(56) References Cited

U.S. PATENT DOCUMENTS

| | | | |
|---|---|---|---|
| 8,674,413 B1* | 3/2014 | Chi ................................ 257/213 |
| 2006/0263699 A1* | 11/2006 | Abatchev et al. ................. 430/5 |
| 2013/0244392 A1* | 9/2013 | Oh et al. ........................ 438/299 |
| 2013/0277720 A1* | 10/2013 | Kim et al. ...................... 257/288 |
| 2014/0065832 A1* | 3/2014 | Hsieh et al. .................... 438/703 |

* cited by examiner

*Primary Examiner* — Kimberly Rizkallah
*Assistant Examiner* — Maria Ligai
(74) *Attorney, Agent, or Firm* — Heslin Rothenberg Farley & Mesiti, P.C.

(57) ABSTRACT

Devices and methods for forming semiconductor devices with fins at tight fin pitches are provided. One method includes, for instance: obtaining an intermediate semiconductor device; growing an epi layer over the substrate; forming a doped layer below the epi layer; depositing a first oxide layer on the epi layer; applying a dielectric material on the first oxide layer; and depositing a lithography stack on the dielectric material. One intermediate semiconductor device includes, for instance: a substrate with at least one n-well region and at least one p-well region; a doped layer over the substrate; an epi layer over the doped layer; a first oxide layer over the epi layer; a dielectric layer over the first oxide layer; and a lithography stack over the dielectric layer.

10 Claims, 19 Drawing Sheets

DEVICES AND METHODS OF FORMING FINS AT TIGHT FIN PITCHES

FIELD OF THE INVENTION

The present invention relates to semiconductor devices and methods of fabricating semiconductor devices, and more particularly, to fins at a tight fin pitch and methods of fabricating semiconductor devices having fins at a tight fin pitch.

BACKGROUND OF THE INVENTION

As fin pitch scales down, it is more difficult to etch away the sacrificial fin hard masks used to guarantee active fin accuracy. In addition, as fins are formed there are non-idealities in terms of critical dimension variations, overlay variations, and resist pull-back during hard mask etch and post lithography expose. Uncut or partially cut fins can cause failures such as gate shorts, epi shorts, or isolation shorts. Currently, fin hard masks are typically made of oxide and SiN bilayers and have a height of approximately 70-120 nm at the time of cutting. Thus, the fin hard masks are tall relative to the ever decreasing fin pitch, which was previously between 48 nm and 60 nm, is currently between 36 nm and 42 nm, and is moving towards sub-30 nm, while the fin width is not scaling at the same rate, and fundamentally cannot scale below 8-10 nm during patterning. If the hard masks are scaled, material selectivity between the oxide, nitride, and silicon may occur. In addition, the current height of the hard masks may result in pullback during hard mask removal. Thus, a thinner hard mask is needed to prevent pullback and improve the fin cut accuracy. However, the currently used nitride hard mask material has a fundamental etch selectivity limitation between the poly, oxide, and nitride preventing it from being used as a hard mask in a thinner layer.

Thus, the fabrication of FinFET devices with tight pitches can be problematic with existing substrates and designs and improved substrates and FinFET device designs are needed for forming FinFET devices with tight fin pitches that maintain the current electrical performance of the resultant semiconductor devices.

BRIEF SUMMARY

The shortcomings of the prior art are overcome and additional advantages are provided through the provision, in one aspect, a method includes, for instance: obtaining an intermediate semiconductor device; growing an epi layer over the substrate; forming a doped layer below the epi layer; depositing a first oxide layer on the epi layer; applying a dielectric material on the first oxide layer; and depositing a lithography stack on the dielectric material. The intermediate semiconductor device including, for instance, a substrate with at least one n-well region and at least one p-well region.

In another aspect, an intermediate semiconductor device which includes, for instance: a substrate with at least one n-well region and at least one p-well region; a doped layer over the substrate; an epi layer over the doped layer; a first oxide layer over the epi layer; a dielectric layer over the first oxide layer; and a lithography stack over the dielectric layer.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain novel FinFET device formation methods and FinFET structures, which provide advantages over the above noted, existing FinFET device fabrication processes and structures. Advantageously, the FinFET device fabrication processes disclosed herein provide for FinFET devices with tight fin pitches, for example, fin pitches of approximately 25 nm and above.

Figure 1:
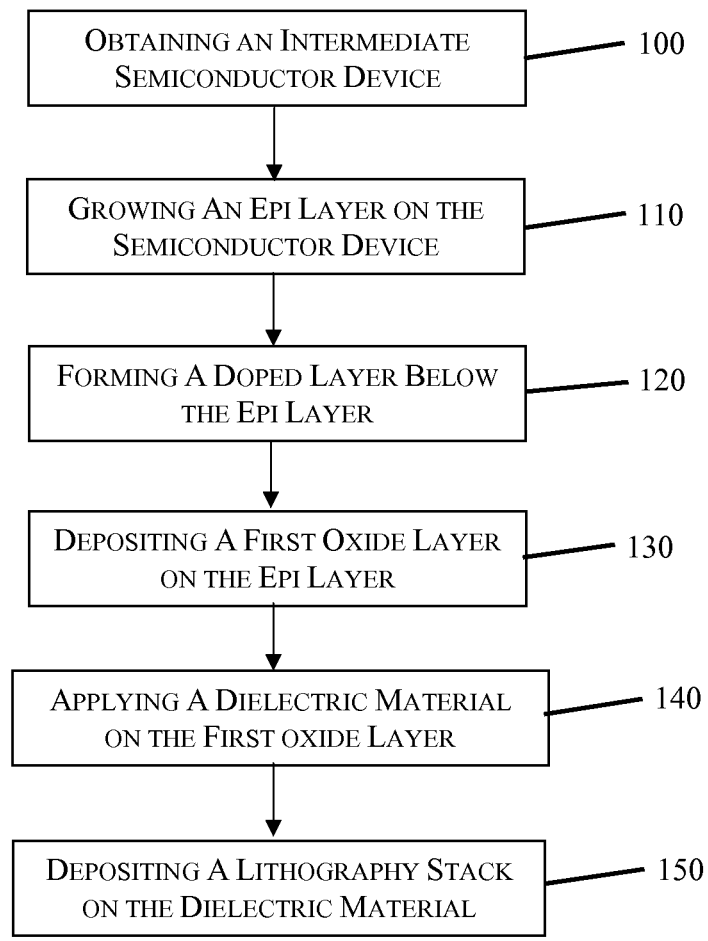
FIG. 1 depicts one embodiment of a process for fabricating, for instance, FinFET devices with tight fin pitches, in accordance with one or more aspects of the present invention.

In one aspect, in one embodiment, as shown in FIG. 1, FinFET device formation in accordance with one or more aspects of the present invention may include, for instance: obtaining an intermediate semiconductor device 100; growing an epi layer on the semiconductor device 110; depositing a doped layer below the epi layer 120; depositing a first oxide layer on the epi layer 130; applying a dielectric material on the first oxide layer 140; and depositing a lithography stack on the dielectric material 150.

Figure 2:
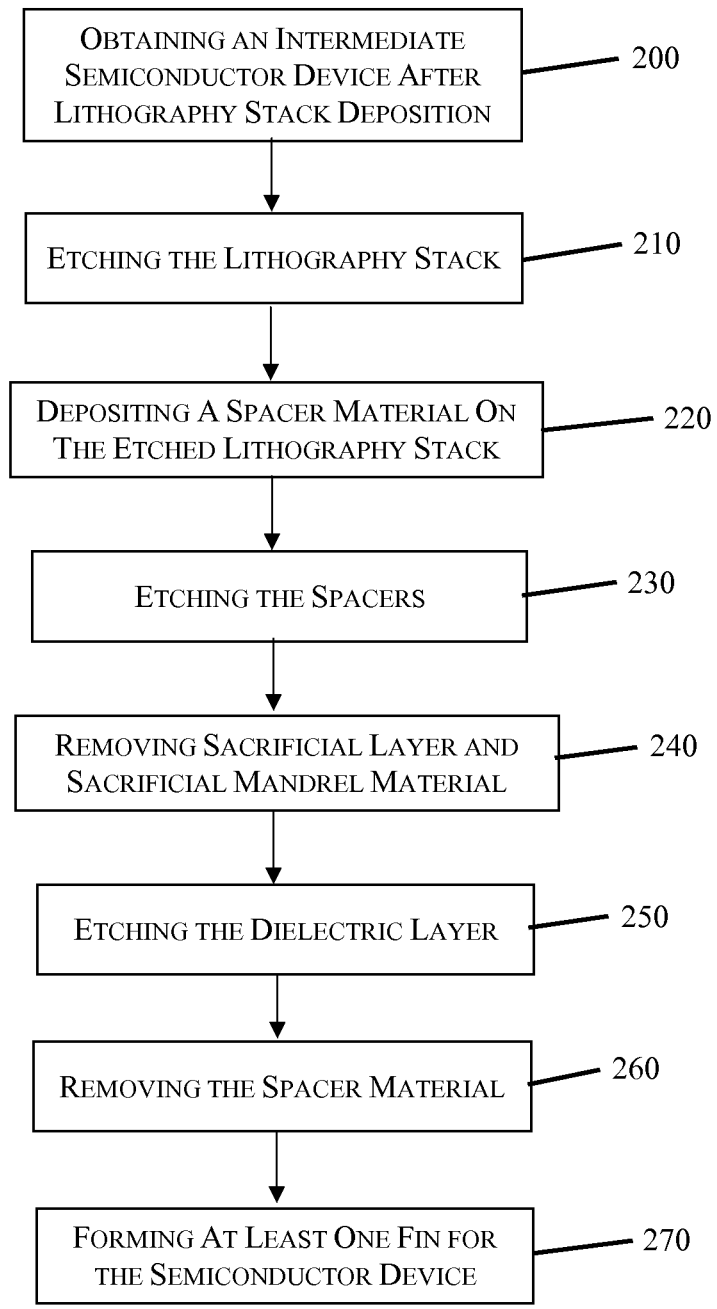
FIG. 2 depicts another embodiment of a process for fabricating, for instance, FinFET devices with tight fin pitches, in accordance with one or more aspects of the present invention.

The process shown in FIG. 1 is inherent in the more detailed FinFET structure formation process shown in FIG. 2. Specifically, the process of FIG. 1 is inherent in obtaining an intermediate semiconductor device 200 of FIG. 2. The FinFET formation process of FIG. 2 is in accordance with one or more aspects of the present invention and may include, for instance: obtaining an intermediate semiconductor device after lithography stack deposition 200; etching the lithography stack 210; depositing a spacer material on the etched lithography stack 220; etching to form spacers 230; removing the sacrificial layer and sacrificial mandrel material 240; etching the dielectric layer 250; removing the spacer material 260; and forming at least one fin for the semiconductor device 270.

FIGS. 3-9 depict, by way of example only, one detailed embodiment of a portion of a FinFET device formation process, and a portion of an intermediate FinFET structure, in accordance with one or more aspects of the present invention. Note again that these figures are not drawn to scale in order to facilitate understanding of the invention, and that the same reference numerals used throughout different figures designate the same or similar elements.

Figure 3:
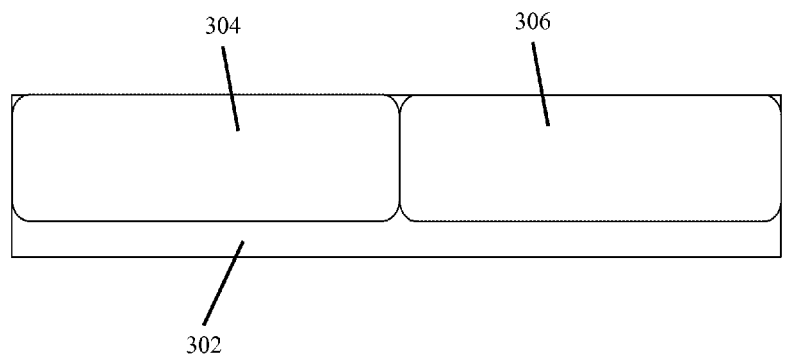
FIG. 3 depicts a cross section of a portion of one embodiment of an intermediate structure of a semiconductor device with an n-well region and a p-well region formed in a substrate, in accordance with one or more aspects of the present invention.

A semiconductor device structure 300 is schematically illustrated in FIG. 3 and may have been processed through, for example, shallow trench isolation (STI), nip well formation, and other initial device processing steps in accordance with the design of the semiconductor device being fabricated. As depicted in FIG. 3, the semiconductor structure 300 may include a substrate 302 which may be made of, for example, a semiconductor material. The semiconductor material may include, e.g., silicon (Si), germanium (Ge), a compound semiconductor material, and a layered semiconductor material. The semiconductor structure 300 may also include at least one n-well region 304 and at least one p-well region 306. The n-well region 304 may be made of, for example, an n-well material and the p-well region 306 may be made of, for example, a p-well material.

Figure 4:
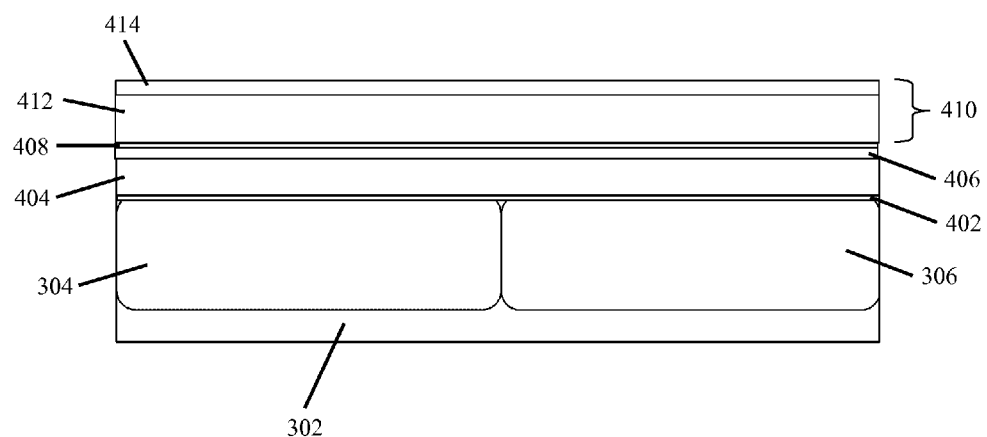
FIG. 4 depicts a cross section of a portion of the intermediate structure of FIG. 3 after formation of a doped layer, an epi layer, an oxide layer, a dielectric material, and a sacrificial lithography stack, in accordance with one or more aspects of the present invention.

The semiconductor structure 300 may then be sent for additional fabrication processing, for example, where an intermediate semiconductor device structure 400, as shown in FIG. 4, may be formed. The intermediate device 400 may include, for example, a doped layer 402 formed over the n-well region 304 and the p-well region 306. The doped layer 402 may be, for example, a carbon doped layer. The device 400 may also include, for example, an epi layer 404 grown over the n-well and p-well regions 304, 306. The epi layer 404 may be, for example, an undoped silicon layer, SiGe layer, or another channel material that will grow on the substrate 302. The epi layer 404 may correspond, for example, to the fin height for the device 400. By way of specific example, the doped layer 402 may be approximately 5 nm and may be formed by insitu-doping the Si epi layer 404 with high levels of carbon directly in the epitaxy after the epi layer 404 is formed. In addition, the intermediate device 400 may include, for example, a first oxide layer 406 deposited onto the epi layer 404. The first oxide layer 406 may alternatively be a nitride layer. The intermediate device 400 may also have a dielectric material 408 deposited on the first oxide layer 406. The intermediate device 400 may further include a sacrificial lithography stack 410 applied onto the dielectric material 408. The sacrificial lithography stack 410 may include, for example, a sacrificial mandrel material 412 and a sacrificial layer 414. In an embodiment, the sacrificial mandrel material 412 may be, for example, an amorphous carbon, and the sacrificial layer 414 may be, for example, a SiON material.

Figure 5:
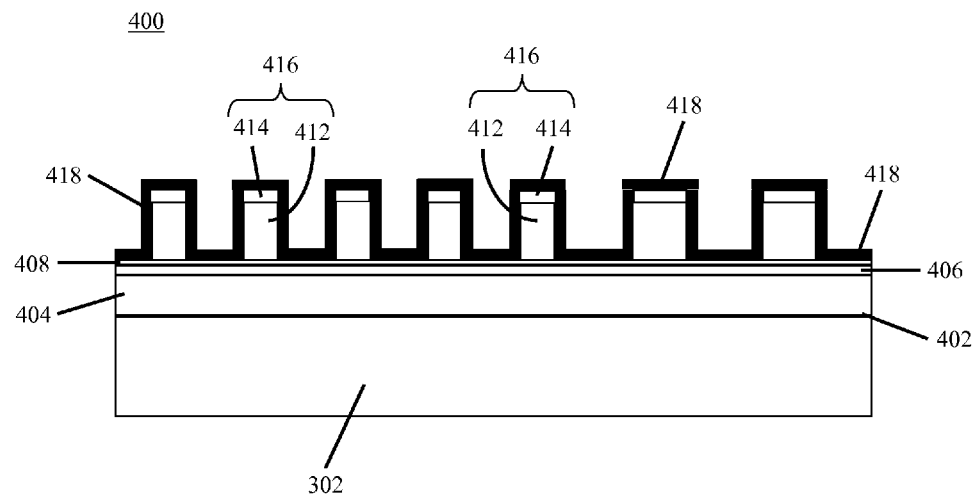
FIG. 5 depicts a cross section of a portion of the intermediate structure of FIG. 4 after etching of the sacrificial lithography stack and application of a spacer material, in accordance with one or more aspects of the present invention.

As shown in FIG. 5, the lithography stack 410 may be etched to form at least one mandrel 416. The spacing and size of the mandrels 416 may correlate to the fin pitch during the fin formation process. The mandrels 416 may include, for example, a sacrificial mandrel material 412 and a sacrificial layer 414. Next a spacer material 418 may be applied over the exposed dielectric material 408 and the mandrels 416, by for example, atomic layer deposition (ALD), such as, sidewall image transfer (SIT) ALD. The spacer material 418 may be made of, for example, SiN.

Figure 6:
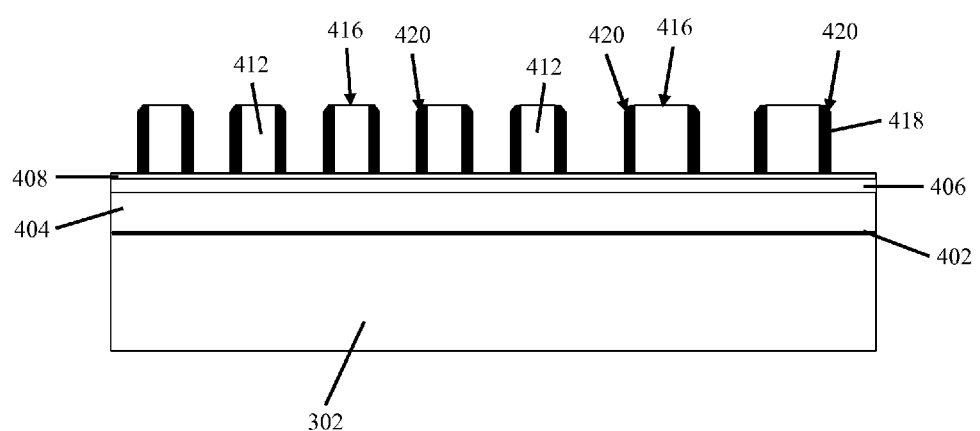
FIG. 6 depicts a cross section of a portion of the intermediate structure of FIG. 5 after etching of the spacer material and sacrificial layer, in accordance with one or more aspects of the present invention.
Figure 7:
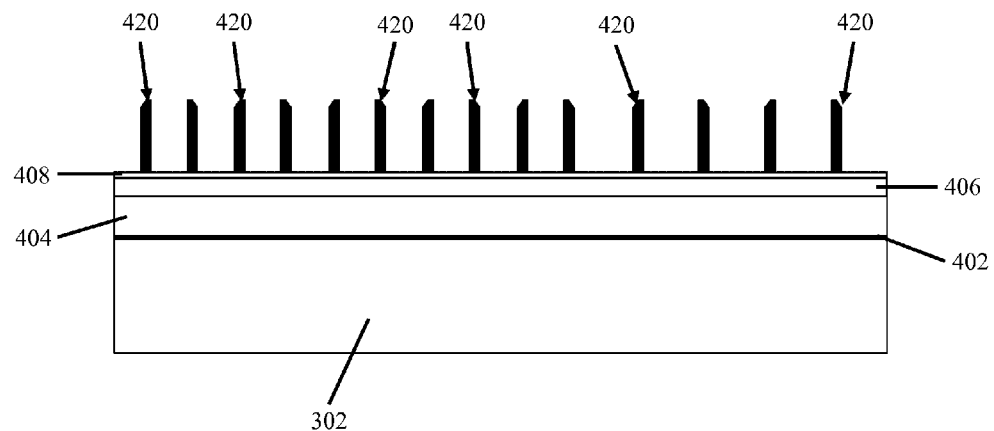
FIG. 7 depicts a cross section of a portion of the intermediate structure of FIG. 6 after removal of the sacrificial mandrel material between the spacers, in accordance with one or more aspects of the present invention.

After the spacer material 418 is applied, the intermediate device 400 may be etched to remove a portion of the spacer material 418 and the sacrificial layer 414. The portion of the spacer material 418 that may be removed during etching may include, for example, the horizontal spacer material 418, leaving vertical sidewall spacers 420 on each side of the mandrels 416, as shown in FIG. 6. The etch may be, for example, a nitrogen etch which will remove the sacrificial layer 414 made of, for example, SiON, as well as etch away the spacer material 418 without etching into the dielectric material 408. Next the mandrel material 412 may be removed by for example a mandrel ashing, as shown in FIG. 7. Once the mandrel material 412 is removed, the position of the remaining sidewall spacers 420 may correspond to the position of the fins that may be formed on the device 400.

Figure 8:
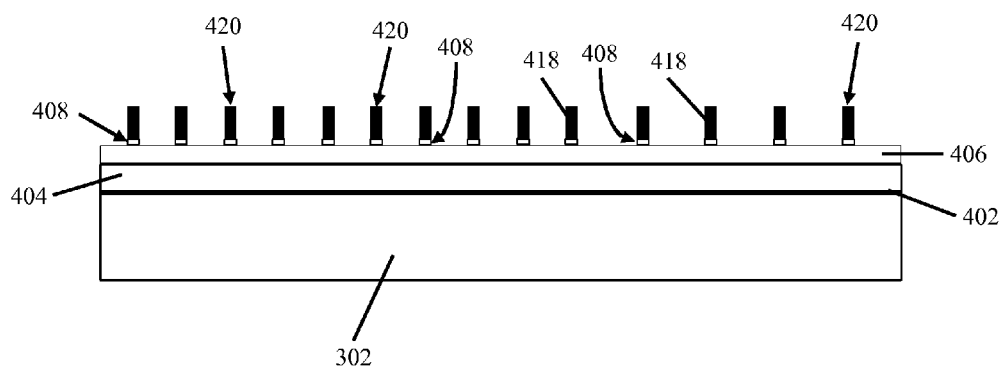
FIG. 8 depicts a cross section of a portion of the intermediate structure of FIG. 7 after etching of the dielectric layer, in accordance with one or more aspects of the present invention.
Figure 9:
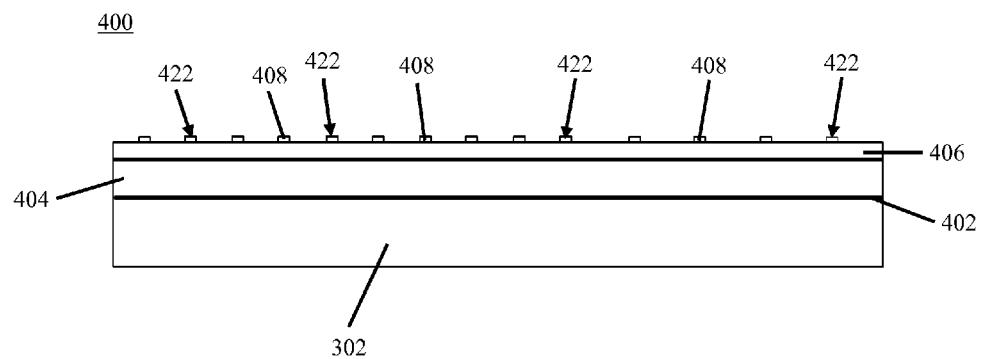
FIG. 9 depicts a cross section of a portion of the intermediate structure of FIG. 8 after removal of the spacers, in accordance with one or more aspects of the present invention.

As shown in FIG. 8, the device 400 may then be etched to remove any of the dielectric layer 408 not masked by the sidewall spacers 420 to form masks 422 under the spacers 420. Etching the dielectric layer 408 may be done with, for example, a chlorine based material that is highly selective to nitrogen and/or oxygen. The dielectric masks 422 are etched from the dielectric layer 408, thus may be, for example, a high-k material, such as, $HfO_2$, $Al_2O_3$, $HfAlO_2$, $ZrO_2$, ZrO, etc. Next, as shown in FIG. 9, if an indirect alignment will be used to cut the device 400, the remaining material 418 of the spacers 420 may be stripped to expose the masks 422. The masks 422 may be a thin transfer layer that is cut to place the fins in the desired position prior to etching. The dielectric masks 422 may be, for example, approximately 1 nm to 4 nm thick. Alternatively, if a direct alignment technique will be used to cut the device 400, the material 418 of the spacers 420 will remain over the masks 422 during the fin cutting process. Then the device 400 may be processed to form the fins, as described in greater detail below with reference to FIGS. 23-35.

Figure 10:
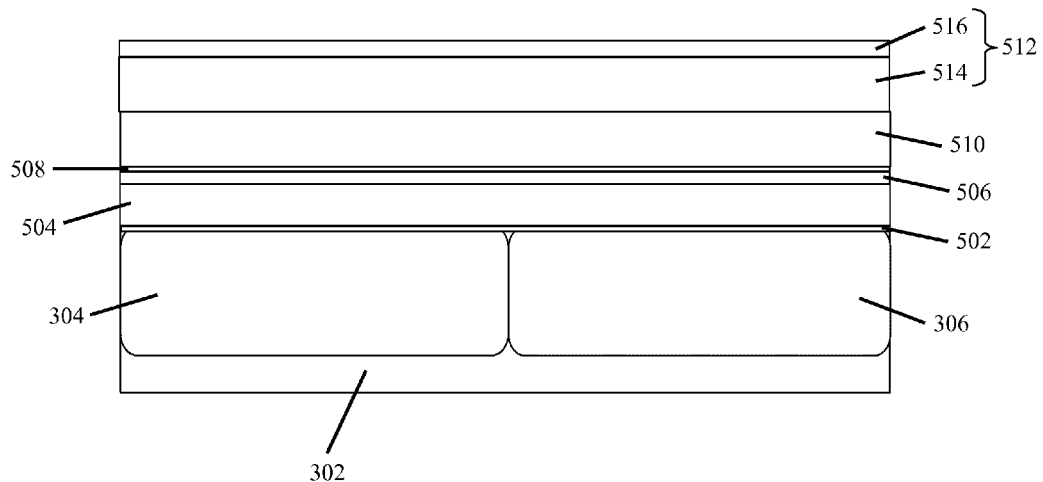
FIG. 10 depicts a cross section of a portion of another embodiment of an intermediate structure of FIG. 3 after formation of a doped layer, an epi layer, a first oxide layer, a dielectric material, a second oxide layer, and a sacrificial lithography stack, in accordance with one or more aspects of the present invention.

Another embodiment intermediate semiconductor device 500 is shown in FIGS. 10-17. The intermediate device 500 may include the semiconductor structure 300 as described above with reference to FIG. 3. As shown in FIG. 10, the device 500 may also include a doped layer 502 over the n-well region 304 and p-well region 306. The doped layer 502 may be of the type described above with reference to doped layer 402, which for brevity sake will not be described again here. The device may also include an epi layer 504 above the doped layer 502, which may be, for example, an undoped Si layer, an undoped SiGe layer with varying percentages of germanium, another material from, for example, Groups III-V that can be grown defect free, or a combination thereof. The thickness of the epi layer 504 may correspond to the height of the fins. A first oxide layer 506 may be deposited over the epi layer 504 and a dielectric material 508 may be deposited over the first oxide layer 506. The first oxide layer 506 may alternatively be a nitride layer. The dielectric material 508 may be a high-k material, for example, $HfO_2$, $Al_2O_3$, $HfAlO_2$, $ZrO_2$, and the like. A second oxide layer 510 may then be deposited over the dielectric material 508. Next a sacrificial lithography stack 512 may be formed on the second oxide layer 510. The lithography stack 512 may include a sacrificial mandrel material 514 and a sacrificial layer 516 as described above with reference to the lithography stack 410, which will not be described again here for brevity sake.

Figure 11:
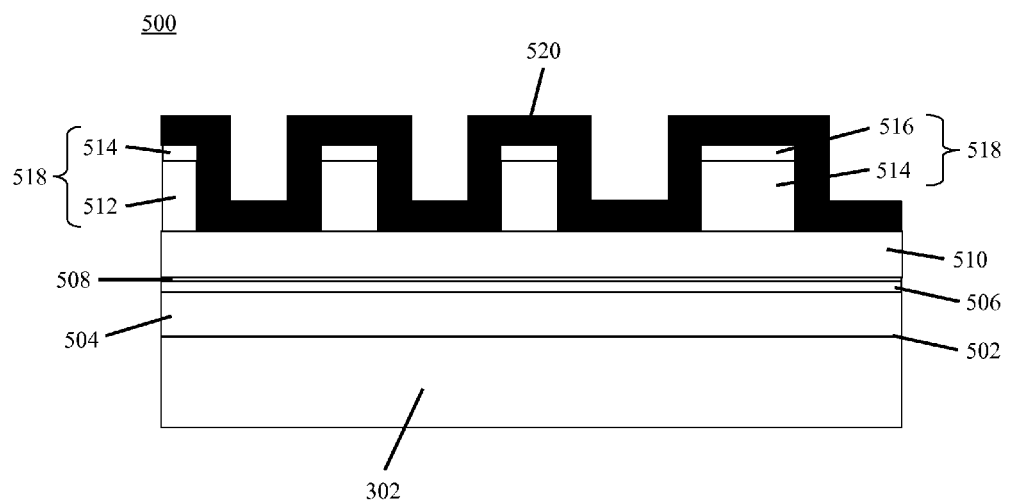
FIG. 11 depicts a cross section of a portion of the intermediate structure of FIG. 10 after etching of the sacrificial lithography stack and application of a spacer material, in accordance with one or more aspects of the present invention.

As shown in FIG. 11, the lithography stack 512 may be etched to form at least one mandrel 518, which may include at least a portion of the sacrificial mandrel material 514 and a portion of the sacrificial layer 516. After the mandrels 518 are formed, a first spacer material 520 may be applied over the device 500 including the mandrels 518. The spacer material 520 may be of the type described above with reference to spacer material 418, and will not be described again here for brevity sake.

Figure 12:
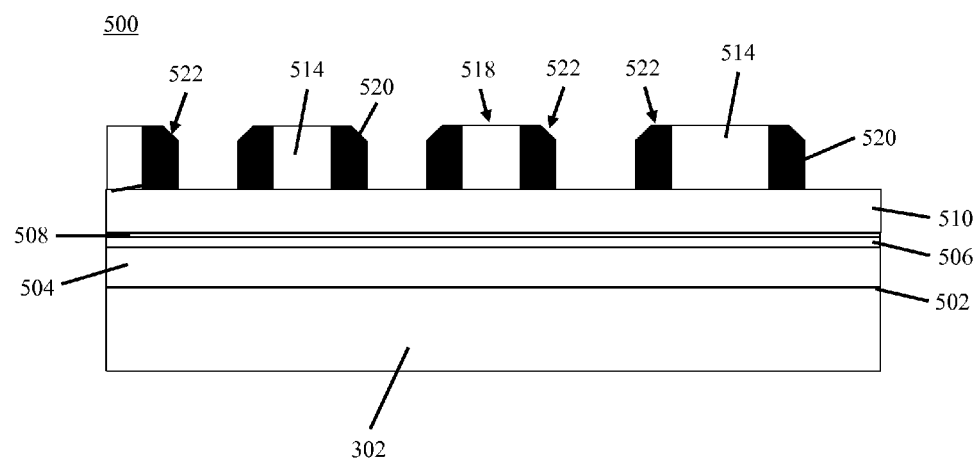
FIG. 12 depicts a cross section of a portion of the intermediate structure of FIG. 11 after etching the spacer material and the sacrificial layer, in accordance with one or more aspects of the present invention.
Figure 13:
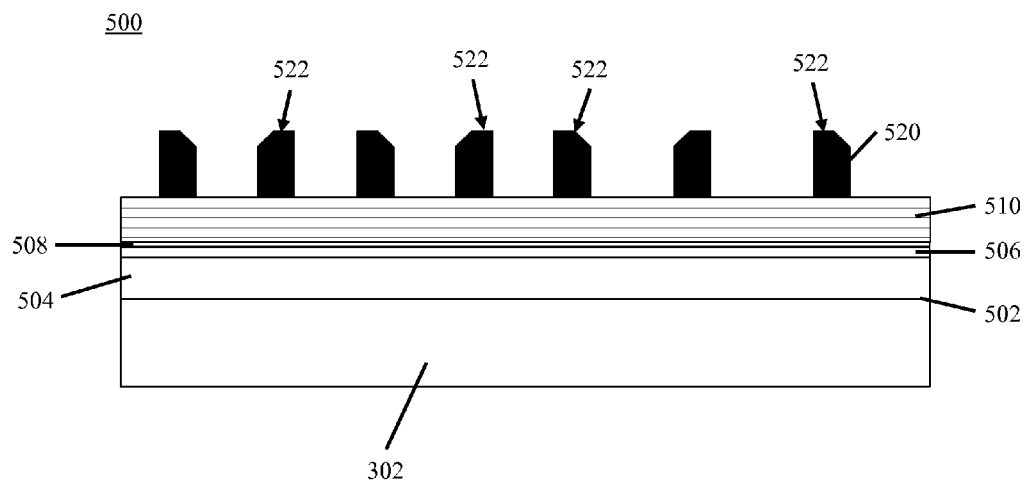
FIG. 13 depicts a cross section of a portion of the intermediate structure of FIG. 12 after removal of the sacrificial mandrel material between the spacers, in accordance with one or more aspects of the present invention.

After applying the spacer material 520, the intermediate device 500 may be etched to remove a portion of the spacer material 520 and the sacrificial layer 516, as shown in FIG. 12. The etching may remove, for example, at least part of the horizontal portions of the spacer material 520 to form sidewall spacers 522 on the vertical side of the mandrels 518. Next, the mandrel material 514 may be removed leaving the sidewall spacers, as shown in FIG. 13.

Figure 14:
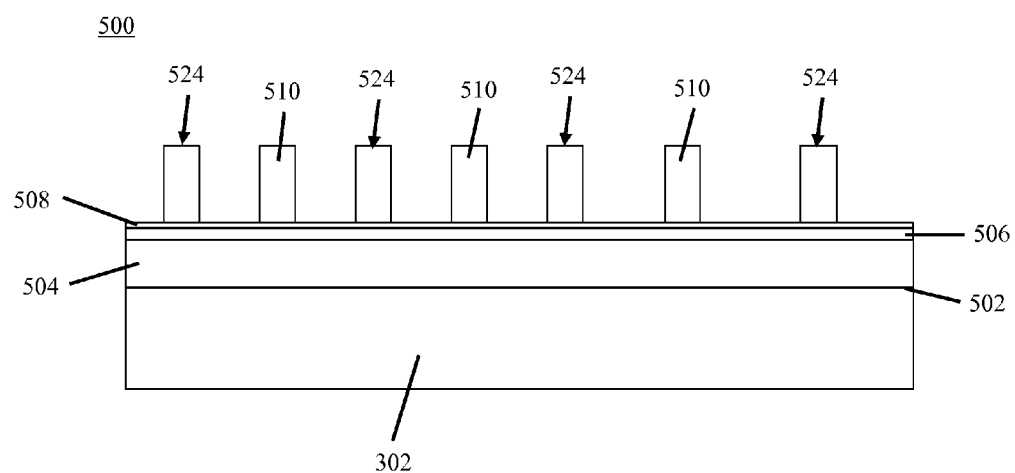
FIG. 14 depicts a cross section of a portion of the intermediate structure of FIG. 13 after etching the second oxide layer, in accordance with one or more aspects of the present invention.
Figure 15:
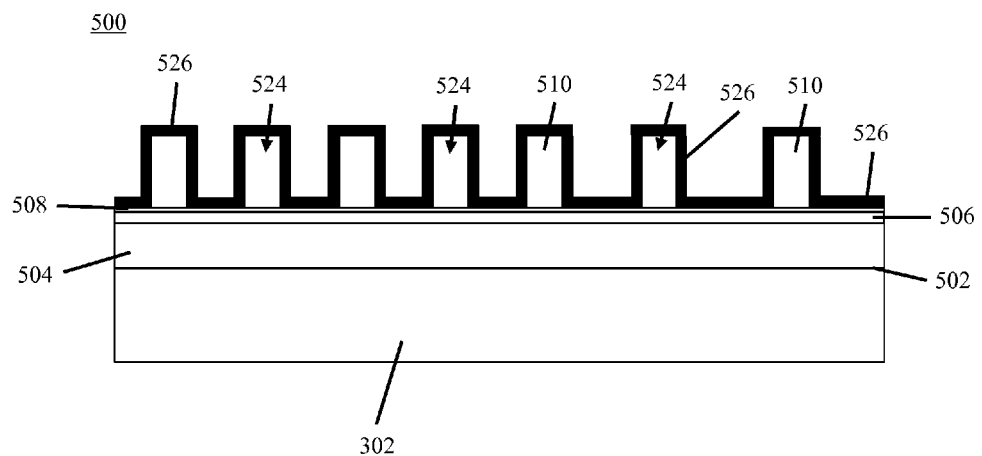
FIG. 15 depicts a cross section of a portion of the intermediate structure of FIG. 14 after application of a spacer material over the second oxide layer, in accordance with one or more aspects of the present invention.
Figure 16:
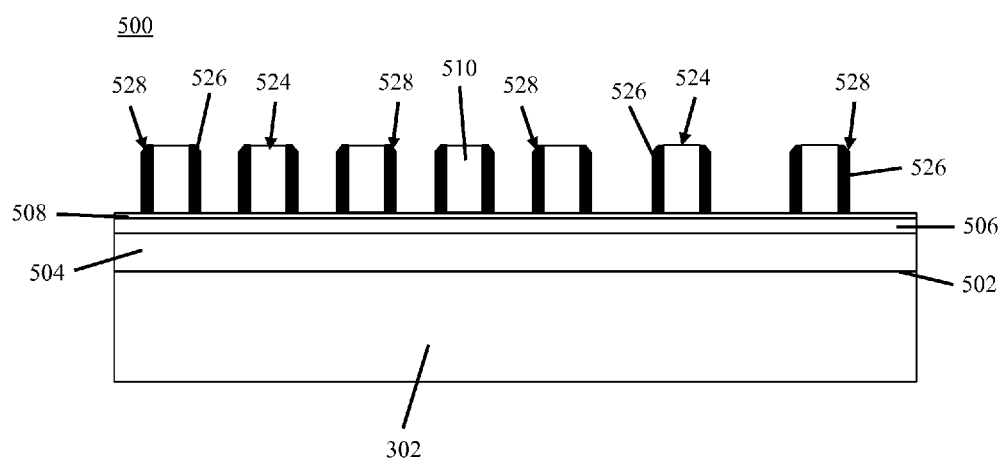
FIG. 16 depicts a cross section of a portion of the intermediate structure of FIG. 15 after etching the spacer material, in accordance with one or more aspects of the present invention.
Figure 17:
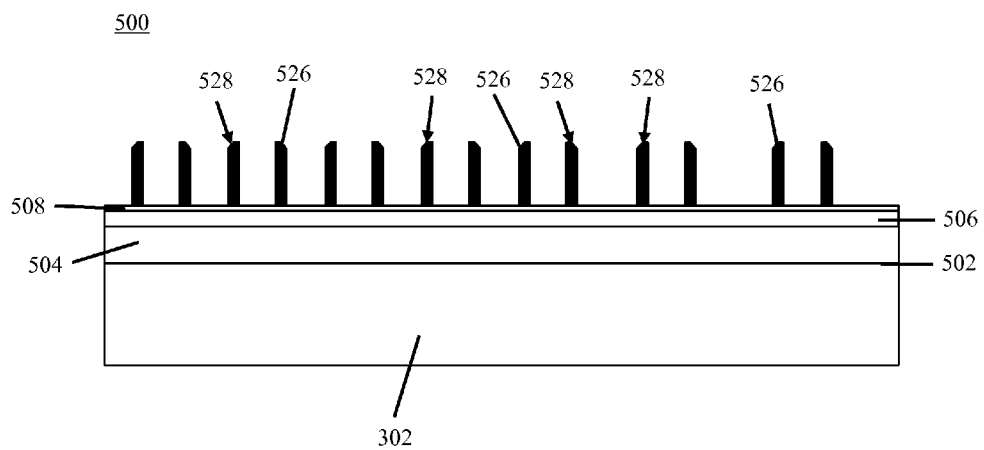
FIG. 17 depicts a cross section of a portion of the intermediate structure of FIG. 16 after removal of the second oxide material between the spacers, in accordance with one or more aspects of the present invention.

As shown in FIG. 14, the device 500 may then be etched using the sidewall spacers 522 as a mask over the second oxide layer 510 to form oxide mandrels 524. A second spacer material 526 may then be applied over the oxide mandrels 524, as shown in FIG. 15. Next, an etch may be performed to remove a portion of the second spacer material 526 and form sidewall spacers 528 on either side of the oxide mandrels 524, as shown in FIG. 16. The spacers 522, 528 may be of the type described above with reference to spacers 420. Following the spacer 528 formation, the oxide mandrels 524 may be removed, as shown in FIG. 17. The remaining sidewall spacers 528 may correspond to the position where the fins will be formed on the device 500. After the spacers 528 are formed the device 500 may proceed to the fabrication processes as described above with reference to FIGS. 8 and 9, which include etching the dielectric material 508 to form dielectric masks 422. As described above with reference to FIG. 9, the device 500 may then be stripped to remove the spacer material 526 and expose the masks 422, if an indirect alignment will be used to cut the device 500. Alternatively, if a direct alignment technique will be used to cut the device 500, the spacer material 526 of the spacers 528 will remain over the masks 422 during the fin cutting process. Next, the device 500 may be processed to form the fins, as described in greater detail below with reference to FIGS. 23-35.

Figure 18:
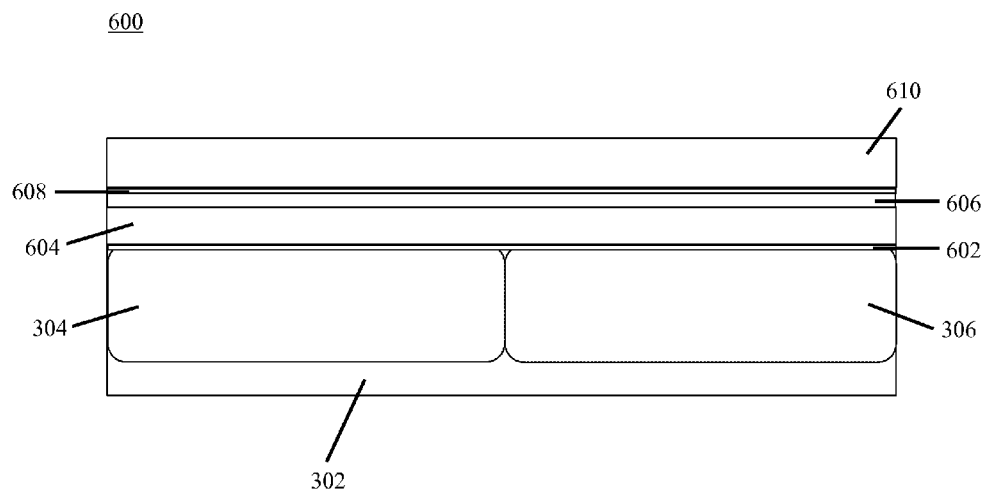
FIG. 18 depicts a cross section of a portion of one embodiment of an intermediate structure of FIG. 3 after formation of a doped layer, an epi layer, a first oxide layer, a dielectric material, and a second oxide layer, in accordance with one or more aspects of the present invention.

FIGS. 18-22 show another embodiment intermediate semiconductor device 600. The intermediate device 600 may include the semiconductor structure 300, as described above with reference to FIG. 3. As shown in FIG. 18, the device 600 may also include a doped layer 602 over the n-well and p-well regions 304, 306. The doped layer 602 may be of the type described above with reference to doped layer 402, which for brevity sake will not be described again here. The device may also include an epi layer 604 over the doped layer 602, which may be, for example, an undoped Si or SiGe layer. The thickness of the epi layer 604 may correspond to the height of the exposed fins. A first oxide layer 606 may be deposited over the epi layer 604 and a dielectric material 608 may be deposited over the first oxide layer 606. The first oxide layer 606 may alternatively be a nitride layer. The dielectric material 608 may be a high-k material, for example, $HfO_2$, $Al_2O_3$, $HfAlO_2$, ZrO, and the like. A second oxide layer 610 may then be deposited over the dielectric material 608.

Figure 19:
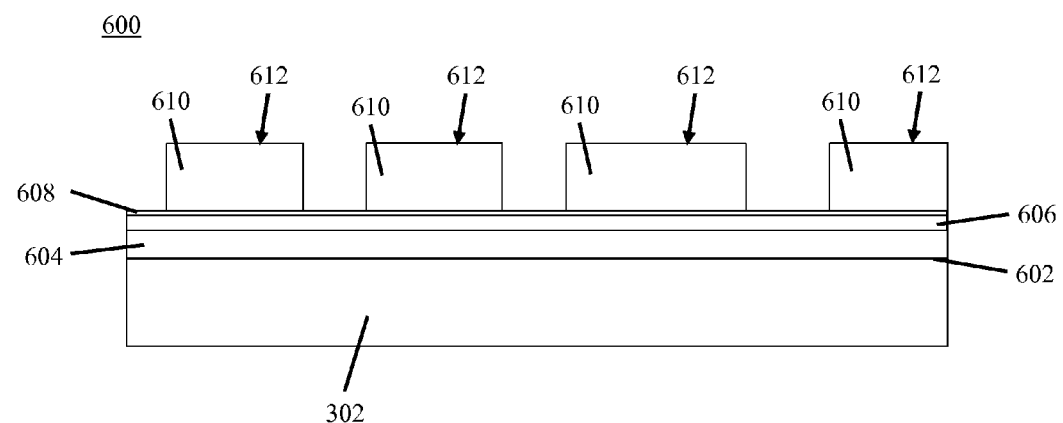
FIG. 19 depicts a cross section of a portion of the intermediate structure of FIG. 18 after a first etch, in accordance with one or more aspects of the present invention.
Figure 20:
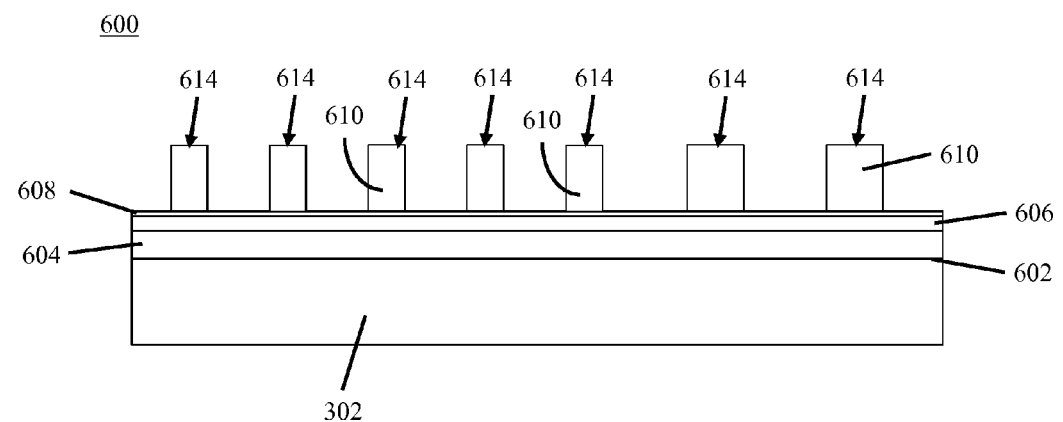
FIG. 20 depicts a cross section of a portion of the intermediate structure of FIG. 19 after a second etch, in accordance with one or more aspects of the present invention.

As shown in FIG. 19, a first lithography etch may be performed on the second oxide layer 610 of the device 600 to form a first set of oxide mandrels 612. Next, as shown in FIG. 20, a second lithography etch may be performed to remove at least a portion of the first set of oxide mandrels 612 to form a second set of oxide mandrels 614. The first and second lithography etches may be, for example, negative tone development (NTD) subtractive etches, although other types of etches are also contemplated.

Figure 21:
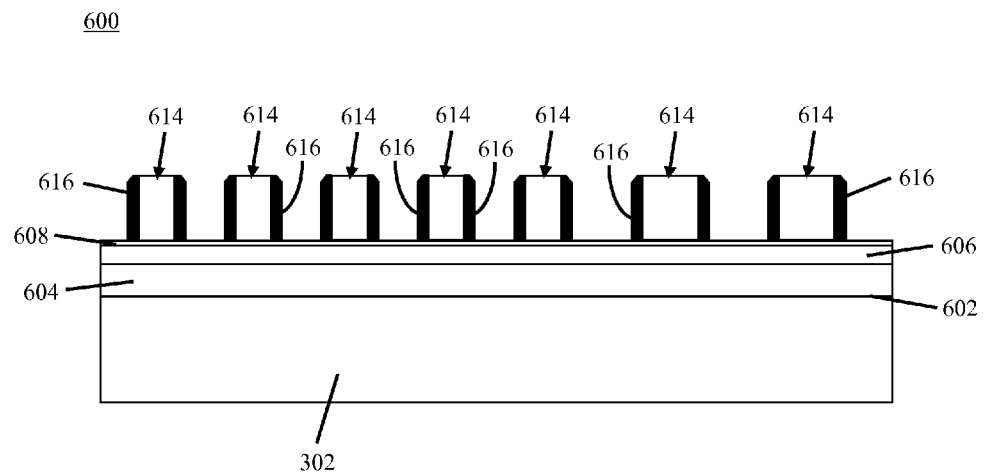
FIG. 21 depicts a cross section of a portion of the intermediate structure of FIG. 20 after deposition and etching of a spacer material, in accordance with one or more aspects of the present invention.
Figure 22:
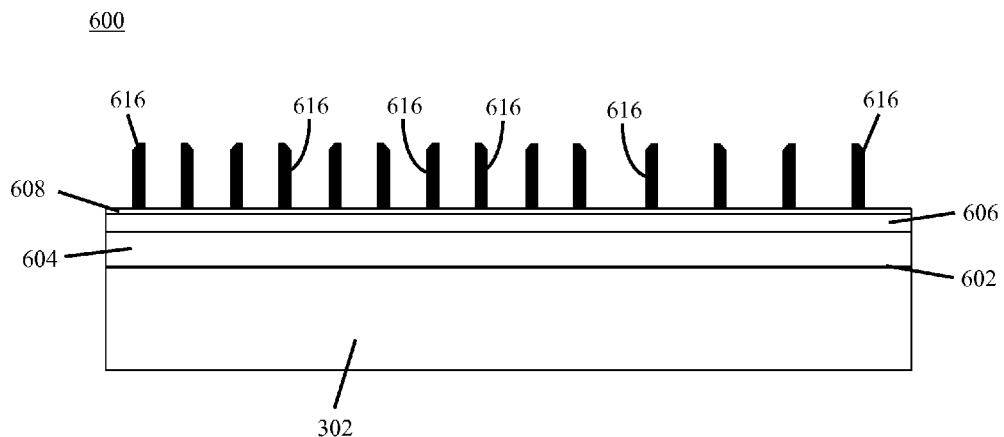
FIG. 22 depicts a cross section of a portion of the intermediate structure of FIG. 21 after removal of the sacrificial mandrel material between the spacers, in accordance with one or more aspects of the present invention.

Once the second set of oxide mandrels 614 is formed a spacer material may be deposited over the device 600 covering the second set of oxide mandrels 614 and the revealed portion of the dielectric material 608. The spacer material may be of the type described above with reference to spacer material 418. An etch may then be performed to remove a portion of the spacer material to form sidewall spacers 616 on the sides of the oxide mandrels 614, as shown in FIG. 21. The sidewall spacers 616 may be of the type described above with reference to sidewall spacers 420. After the sidewall spacers 616 are formed the oxide mandrels 614 may be removed, as shown in FIG. 22. The oxide mandrels 614 may be removed by, for example, an oxide mandrel strip using a diluted hydrofluoric acid (dHF) which is selective to the dielectric material 608 and the sidewall spacers 616.

After the sidewall spacers 616 are formed the device 600 may proceed to the fabrication processes as described above with reference to FIGS. 8 and 9 which include etching the dielectric material 608 to form dielectric masks 422. As described above with reference to FIG. 9, the device 600 will then be stripped to remove the sidewall spacers 616 and expose the masks 422, if an indirect alignment will be used to cut the device 600. Alternatively, if a direct alignment technique will be used to cut the device 600, the spacer material of the spacers 616 will remain over the masks 422 during the fin cutting process. Next, the device 600 may be processed to form the device fins, as described in greater detail below with reference to FIGS. 23-35.

Figure 23:
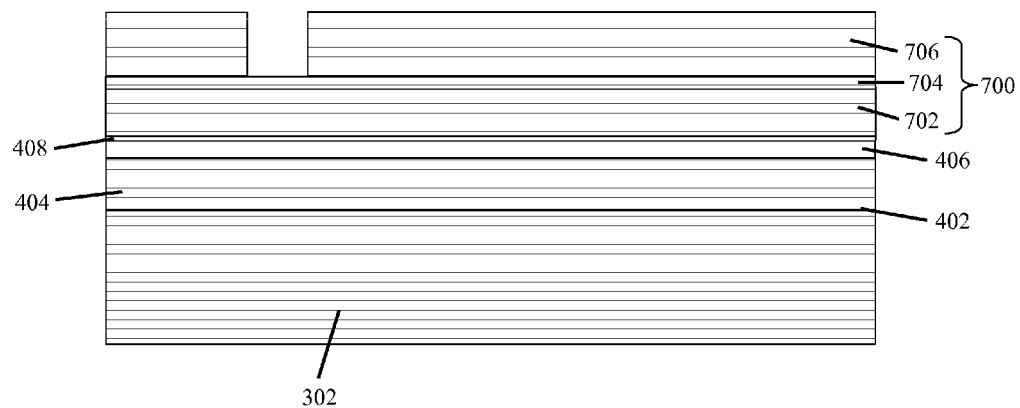
FIG. 23 depicts a cross section in a first plane of a portion of the intermediate structure of FIG. 9 after application of a tri-layer mask stack and performing lithography for a fin cut mask, in accordance with one or more aspects of the present invention.

As shown in FIGS. 23-35, after formation of the masks 422, the devices 400, 500 and 600 may be passed to the fin formation processes. The fin formation processes may include, for example, super steep retrograde well (SSRW) processes, self-aligned quadruple patterning (SAQP) processes, litho-etch-litho-etch (LELE) self-aligned double patterning (SADP) processes, and the like. By way of specific example, device 400 will be used to describe the fin formation processes shown in FIGS. 23-35. It will be understood by one skilled in the art that devices 500 and 600 may be inserted in place of device 400 in FIGS. 23-35 for the fin formation processes. As shown in FIG. 23, a mask stack 700, for example, a tri-layer mask stack, may be applied on the device 400 of FIG. 9 over the masks 422 formed of the dielectric material 408. The mask stack 700 may include, for example, an organic planarization layer (OPL) 702, a silicon containing anti-reflective coating (SiARC) layer 704, and a photoresist layer 706.

Figure 24:
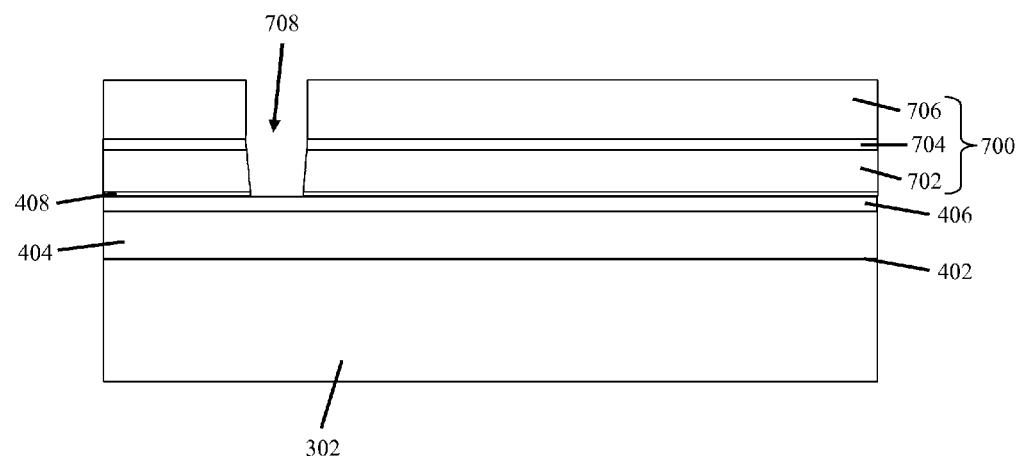
FIG. 24 depicts a cross section in the first plane of a portion of the intermediate structure of FIG. 23 after etching into the tri-layer mask stack over the fin cut mask, in accordance with one or more aspects of the present invention.
Figure 25:
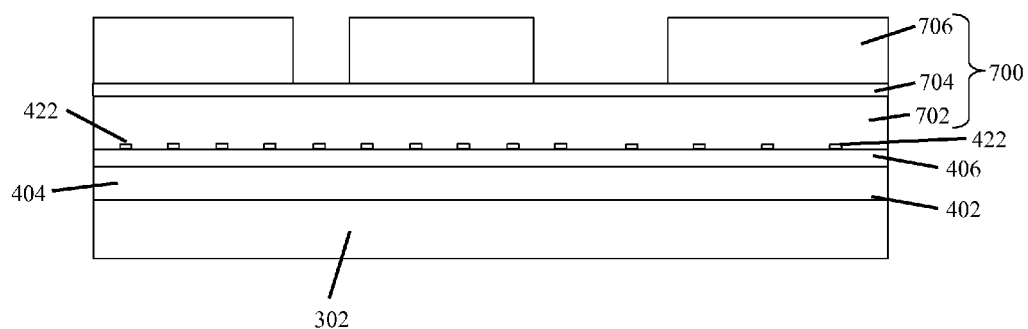
FIG. 25 depicts a cross section in a second plane of a portion of the intermediate structure of FIG. 23 after performing lithography for a fin preserving mask, in accordance with one or more aspects of the present invention.
Figure 26:
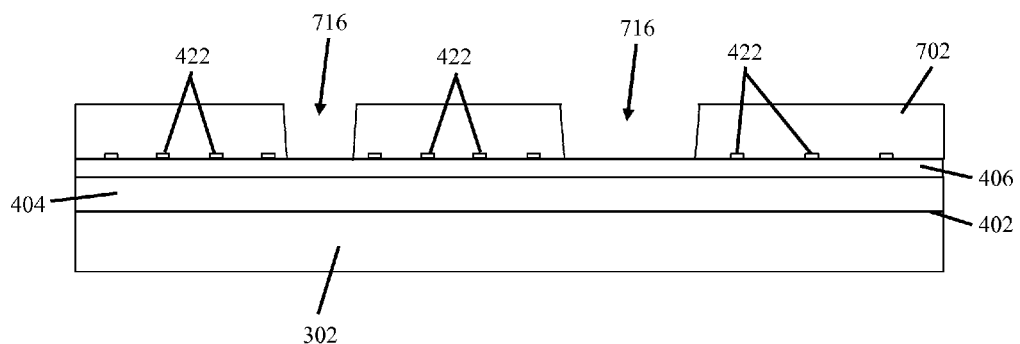
FIG. 26 depicts a cross section in the second plane of a portion of the intermediate structure of FIG. 24 after etching over the fin preserving mask, in accordance with one or more aspects of the present invention.

After the mask stack 700 is formed, a first pattern for cutting the device 400 based on the location of the masks 422 may be transferred to the photoresist layer 706 by, for example, lithography, as shown in FIG. 23. Next a first etch may be performed to remove a portion of the SiARC layer 704, the OPL layer 702, and portions of the dielectric material 408 creating at least one first cut mask 708 for making a first cut, as shown in FIG. 24. The first pattern and first etch, shown in FIGS. 23-24, may be performed in a first direction. Then, as shown in FIGS. 25-26, a second pattern and second etch are performed in a second direction. FIG. 25 shows a second pattern for cutting the device 400 transferred to the photoresist layer 706 by, for example, lithography. The second etch is then performed to remove portions of the SiARC layer 704, the OPL layer 702, and portions of the dielectric material 408 forming at least one second cut mask 716 for making a second cut, as shown in FIG. 26. During the etching of the device 400, pull back of the OPL layer 702 may occur, but it does not clip the masks 422 because they may be formed thin enough to prevent removal of a portion of the masks 422. After the second etching is performed to remove portions of the dielectric material 408, the OPL layer 702 may then be removed.

Figure 27:
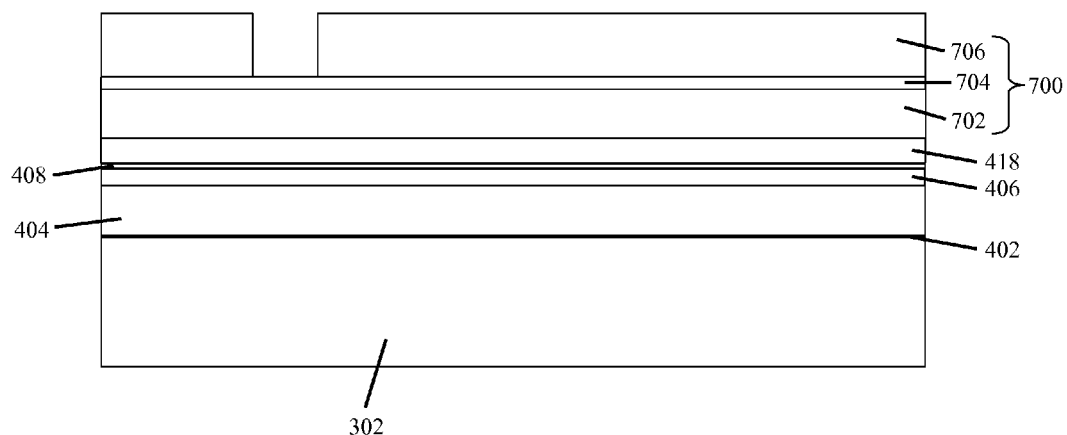
FIG. 27 depicts a cross section in a first plane of a portion of the intermediate structure of FIG. 8 after application of a tri-layer mask stack and performing lithography for a fin cut mask, in accordance with one or more aspects of the present invention.
Figure 28:
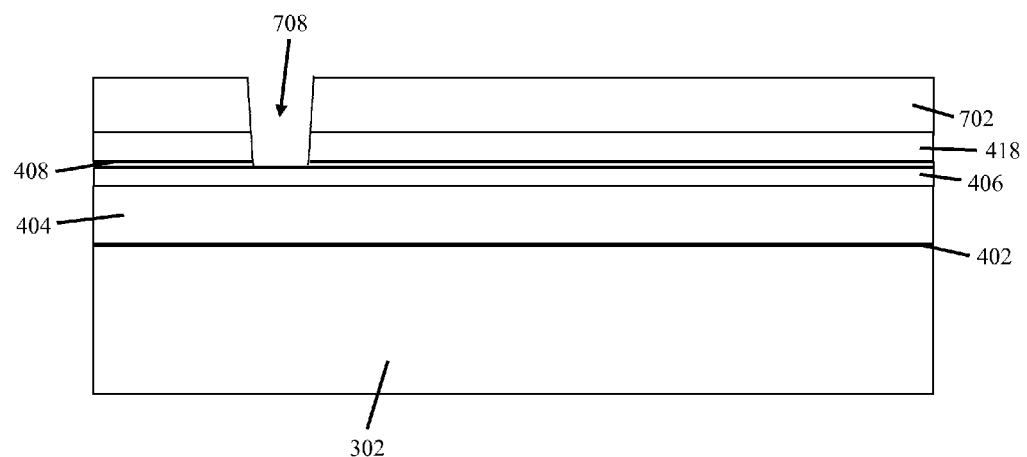
FIG. 28 depicts a cross section in the first plane of a portion of the intermediate structure of FIG. 27 after etching into the tri-layer mask stack over the fin cut mask, in accordance with one or more aspects of the present invention.
Figure 29:
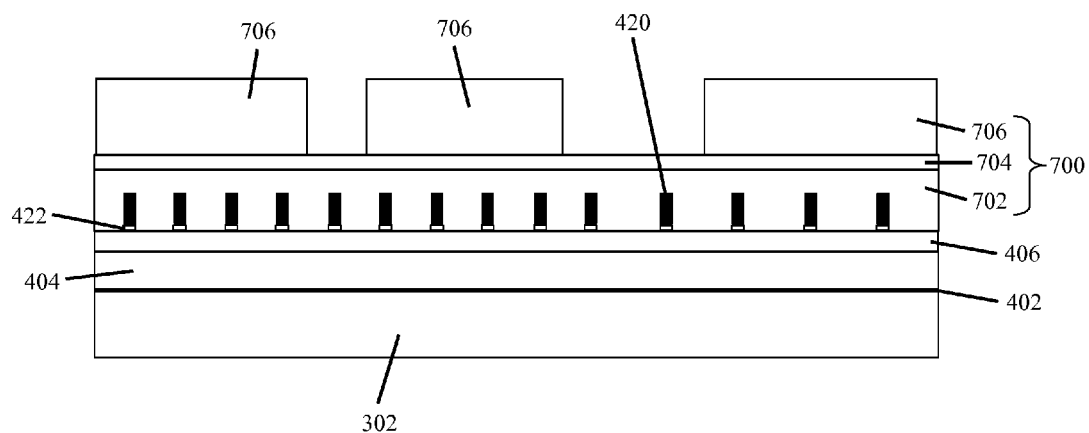
FIG. 29 depicts a cross section in a second plane of a portion of the intermediate structure of FIG. 27 after performing lithography for a fin preserving mask, in accordance with one or more aspects of the present invention.
Figure 30:
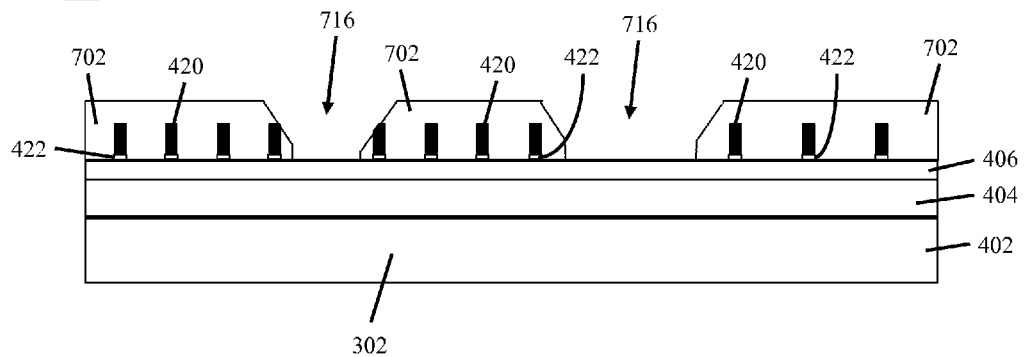
FIG. 30 depicts a cross section in the second plane of a portion of the intermediate structure of FIG. 28 after etching over the fin preserving mask, in accordance with one or more aspects of the present invention.
Figure 31:
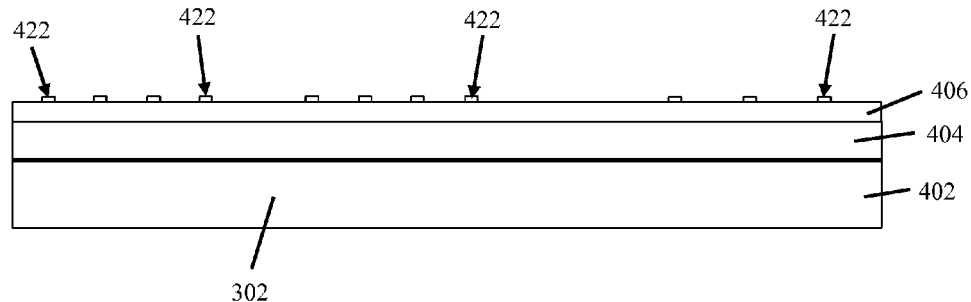
FIG. 31 depicts a cross section in the second plane of a portion of the intermediate structure of FIG. 30 after revealing the dielectric masks, in accordance with one or more aspects of the present invention.

Alternatively, the spacers 420 may be left over the masks 422 to form tall masks made of, for example, the spacers 420 and masks 422, for direct alignment of the device 400 during the fin fabrication process. As shown in FIG. 27, a mask stack 700, for example, the tri-layer mask stack described in greater detail above with reference to FIG. 23 and which will not be described here again for brevity sake, may be applied on the device 400 of FIG. 8 over the tall masks 420, 422. Next a first pattern for cutting the device 400 based on the location of the spacers 420 and masks 422 may be transferred to the photoresist layer 706 by, for example, lithography, as shown in FIG. 27. Then a first etch may be performed to remove a portion of the SiARC layer 704, the OPL layer 702, the spacer material 418, and the dielectric material 408 to form at least one first cut mask 708 for making a first cut, as shown in FIG. 28. Then, as shown in FIGS. 29-30, a second pattern and second etch may be performed. The second pattern for cutting the device 400 is then transferred to the photoresist layer 706 by, for example, lithography, as shown in FIG. 29. The second etch is then performed to remove at least a portion of the SiARC layer 704 and portions of the OPL layer 702, the spacers 420, and the masks 422 forming at least one second cut mask 716 for making a second cut, as shown in FIG. 30. During the second etch, portions of the spacers 420 may be removed, however the dielectric masks 422 will not be revealed if portions of the spacers 420 are removed. After the second etching is performed to remove portions of the spacers 420 and the masks 422, then any remaining portions of the SiARC layer 704 and the OPL layer 702 may be removed. In addition, the remaining spacers 420 may be removed to reveal the masks 422, as shown in FIG. 31.

Figure 32:
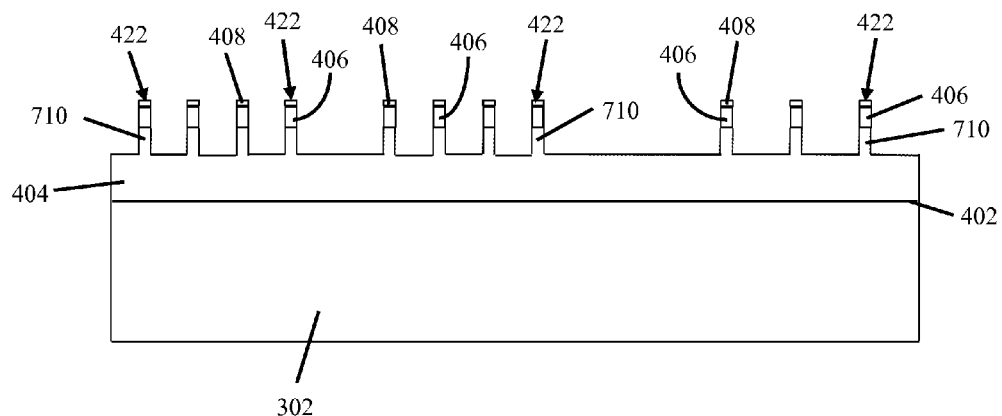
FIG. 32 depicts a cross section of a portion of the intermediate structure of FIG. 31 after etching at least one fin, in accordance with one or more aspects of the present invention.

In both the indirect alignment and direct alignment fabrication processes, a fin etch may then be performed over the masks 422 to expose a portion of the fins 710, as shown in FIG. 32. At least a portion of the first oxide layer 406 may be removed during the fin etch to enable removal of a portion of the epi layer 404 to form fins 710. By way of specific example, if a Cl-based fin etch is used, the dielectric masks 422 act as a transfer layer for the oxide open and the etched portion of the oxide layer 406 becomes the hard masks for the fin etching. With a Cl-based fin etch, the device 400 may include a thick oxide layer 406 and a thinner dielectric layer 408. In another embodiment, by way of specific example, if a F-based fin etch is used, the dielectric masks 422 are the hard masks for the fin etching process and the first oxide layer 406 acts as a patterning stop. With a F-based fin etch, the device 400 may include a thinner oxide layer 406 and a thicker dielectric layer 408. The masks 422 may have a thickness of, for example, approximately 1 nm to 4 nm, and the remaining portions of the etched oxide layer 406 may have a thickness of, for example, approximately 20 nm to 40 nm.

Figure 33:
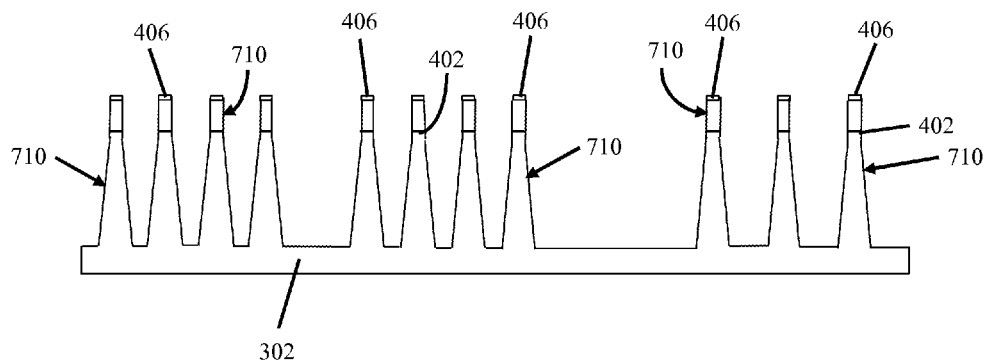
FIG. 33 depicts a cross section of a portion of the intermediate structure of FIG. 32 after removing the dielectric material and performing a second fin etch, in accordance with one or more aspects of the present invention.
Figure 34:
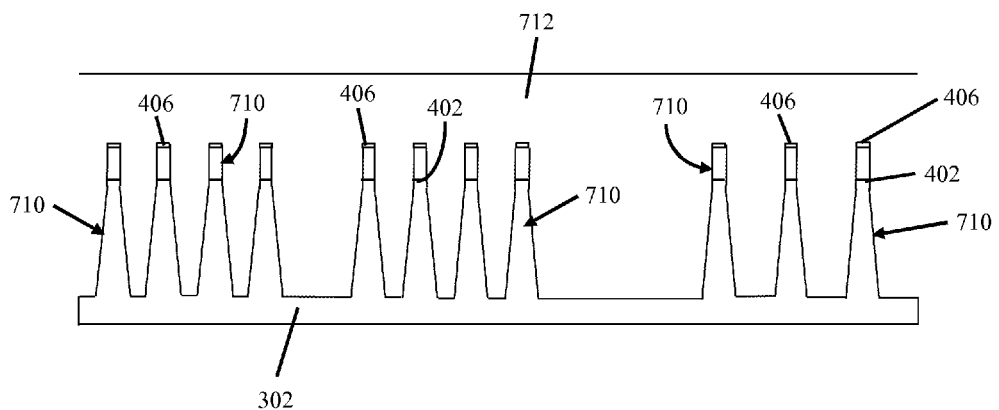
FIG. 34 depicts a cross section of a portion of the intermediate structure of FIG. 33 after application of an oxide gapfill, in accordance with one or more aspects of the present invention.
Figure 35:
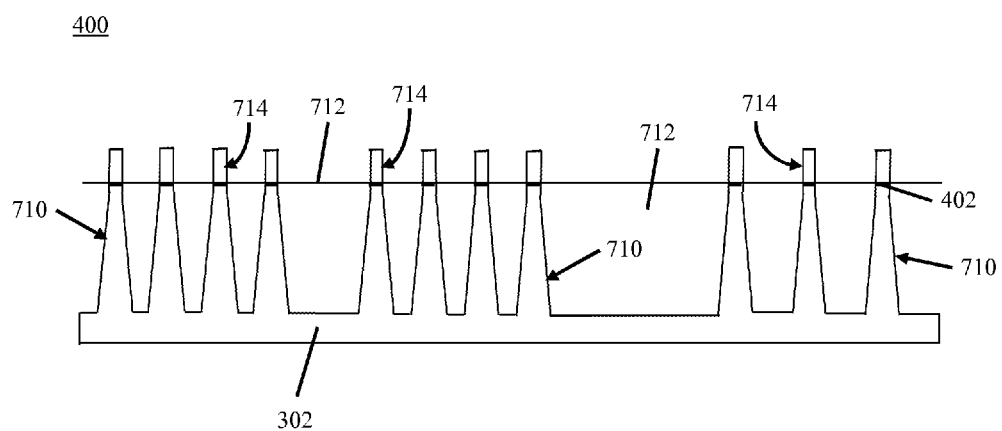
FIG. 35 depicts a cross section of a portion of the intermediate structure of FIG. 34 after etching to reveal a portion of the at least one fin, in accordance with one or more aspects of the present invention.

As shown in FIG. 33, the device 400 may then be etched to remove the dielectric layer 408 and to etch the rest of the fins 710. A Cl-etch may be used to remove the dielectric masks 422 from the device 400. Once the fins 710 are formed, an oxide material 712 may then be applied over the device 400 to create a stress buffer, as shown in FIG. 34. In addition, a flowable oxide may be applied over the device 400 by, for example, flowable chemical vapor deposition (FCVD). The oxide may then be planarized and etched to reveal the exposed fin 714 at a desired height. The etching may remove the oxide layer 406 from the top surface of the fins 710, as shown in FIG. 35. Finally, the device 400 may be cut along the first and second cut masks to form the resultant semiconductor device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    obtaining an intermediate semiconductor device, comprising:
        a substrate with at least one n-well region and at least one p-well region;
    growing an epi layer over the substrate;
    forming a doped layer below the epi layer;
    depositing a first oxide layer on the epi layer;
    applying a dielectric material on the first oxide layer;
    depositing a lithography stack on the dielectric material;
    etching the lithography stack to form at least one mandrel;
    applying a spacer layer over the at least one mandrel;
    etching the spacer layer to form at least one spacer;
    removing the at least one mandrel;
    etching the dielectric material to form at least one dielectric mask;
    removing the at least one spacer;
    etching at least one fin using the at least one dielectric mask;
    applying a mask stack over the at least one dielectric mask;
    performing a first lithography on the mask stack to form a first pattern;
    etching the semiconductor device to form at least one first cut mask;
    performing a second lithography on the mask stack to form a second pattern; and
    etching the semiconductor device to form at least one second cut mask.

2. The method of claim 1, wherein the lithography stack comprises:
    a sacrificial mandrel material; and
    a sacrificial layer on the sacrificial mandrel material.

3. The method of claim 1, wherein the lithography stack comprises:
    a second oxide layer;
    a sacrificial mandrel material on the second oxide layer; and
    a sacrificial layer on the sacrificial mandrel material.

4. The method of claim 1, wherein the lithography stack comprises:
    a second oxide layer.

5. The method of claim 1, further comprising:
    making a first cut on the at least one first cut mask; and
    making a second cut on the at least one second cut mask.

6. A method comprising:
    obtaining an intermediate semiconductor device, comprising:

a substrate with at least one n-well region and at least one p-well region;
growing an epi layer over the substrate;
forming a doped layer below the epi layer;
depositing a first oxide layer on the epi layer;
applying a dielectric material on the first oxide layer;
depositing a lithography stack on the dielectric material;
etching the lithography stack to form at least one mandrel;
applying a spacer layer over the at least one mandrel;
etching the spacer layer to form at least one spacer;
removing the at least one mandrel;
etching the dielectric material to form at least one dielectric mask;
etching at least one fin over at least one tall mask, wherein the at least one tall mask comprises the at least one spacer and the at least one dielectric mask;
applying a mask stack over the at least one tall mask;
performing a first lithography on the at least one tall mask to form a first pattern;
performing an etch to the semiconductor device using the first pattern to form at least one first cut mask;
performing a second lithography on the at least one tall mask to form a second pattern;
etching the semiconductor device to form at least one second cut mask;
removing any remaining mask stack;
removing the at least one spacer; and
forming at least one fin using the at least one dielectric mask.

7. The method of claim 6, wherein the lithography stack comprises:
a sacrificial mandrel material; and
a sacrificial layer on the sacrificial mandrel material.

8. The method of claim 6, wherein the lithography stack comprises:
a second oxide layer;
a sacrificial mandrel material on the second oxide layer; and
a sacrificial layer on the sacrificial mandrel material.

9. The method of claim 6, wherein the lithography stack comprises:
a second oxide layer.

10. The method of claim 6, further comprising:
making a first cut on the at least one first cut mask; and
making a second cut on the at least one second cut mask.

* * * * *